United States Patent
Lee et al.

(10) Patent No.: US 9,287,420 B2
(45) Date of Patent: Mar. 15, 2016

(54) SOLAR CELL AND PASTE COMPOSITION FOR REAR ELECTRODE OF THE SAME

(75) Inventors: Sun Mi Lee, Seoul (KR); In Jae Lee, Seoul (KR); Soon Gil Kim, Seoul (KR); Sang Gon Kim, Seoul (KR); Jun Phill Eom, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/813,260

(22) PCT Filed: Jul. 29, 2011

(86) PCT No.: PCT/KR2011/005634
§ 371 (c)(1),
(2), (4) Date: Jan. 30, 2013

(87) PCT Pub. No.: WO2012/015283
PCT Pub. Date: Feb. 2, 2012

(65) Prior Publication Data
US 2013/0126797 A1    May 23, 2013

(30) Foreign Application Priority Data
Jul. 30, 2010   (KR) .................. 10-2010-0074425

(51) Int. Cl.
*H01B 1/02* (2006.01)
*H01B 1/22* (2006.01)
*H01L 31/0224* (2006.01)

(52) U.S. Cl.
CPC .......... *H01L 31/022425* (2013.01); *H01B 1/22* (2013.01); *Y02E 10/50* (2013.01)

(58) Field of Classification Search
CPC .. H01B 1/22; H01L 31/022425; Y02E 10/50; Y02E 10/52
USPC .................. 252/512–514; 136/252–256, 261; 438/72; 106/31.92; 524/251
See application file for complete search history.

(56) References Cited

U.S. PATENT DOCUMENTS

| | | | |
|---|---|---|---|
| 3,935,147 A * | 1/1976 | Godshalk et al. | 524/251 |
| 7,879,262 B2 | 2/2011 | Katoh et al. | |
| 8,226,856 B2 | 7/2012 | Carroll et al. | |
| 2007/0221270 A1* | 9/2007 | Watsuji et al. | 136/256 |
| 2008/0135097 A1* | 6/2008 | Kikuchi et al. | 136/261 |
| 2009/0140217 A1* | 6/2009 | Wang et al. | 252/514 |
| 2009/0229665 A1 | 9/2009 | Young et al. | |
| 2010/0227433 A1 | 9/2010 | Konno | |

(Continued)

FOREIGN PATENT DOCUMENTS

| KR | 10-2006-0108550 A | 10/2006 |
|---|---|---|
| KR | 10-2008-0057230 A | 6/2008 |
| KR | 10-0837994 B1 | 6/2008 |

(Continued)

OTHER PUBLICATIONS

Office Action dated Aug. 30, 2013 in Taiwanese Application No. 100127183, filed Aug. 1, 2011.

(Continued)

*Primary Examiner* — Khanh Tuan Nguyen
(74) *Attorney, Agent, or Firm* — Saliwanchik, Lloyd & Eisenschenk

(57) ABSTRACT

A paste composition for a rear electrode of a solar cell according to the embodiment includes conductive powder; an organic vehicle; and an additive including silicon or a metal.

5 Claims, 1 Drawing Sheet

(56) References Cited

U.S. PATENT DOCUMENTS

2011/0159633 A1* 6/2011 Kim .............................. 438/72
2011/0203659 A1 8/2011 Carroll et al.

FOREIGN PATENT DOCUMENTS

| KR | 10-2010-0080613 A | | 7/2010 | |
| TW | 2010-03676 A | | 1/2010 | |
| TW | 201123464 | * | 7/2011 | .......... H01L 31/0224 |
| TW | 201123464 A | | 7/2011 | |
| WO | WO 2010/056826 A1 | * | 5/2010 | .............. H01L 23/48 |
| WO | WO 2011/055995 A2 | * | 5/2011 | ............... H01B 1/22 |

OTHER PUBLICATIONS

International Search Report in International Application No. PCT/KR2011/005634, filed Jul. 29, 2011.
Notice of Allowance dated Jun. 28, 2012 in Korean Application No. 10-2010-0074425, filed Jul. 30, 2010.
Office Action dated Feb. 26, 2014 in Taiwanese Application No. 100127183.

* cited by examiner

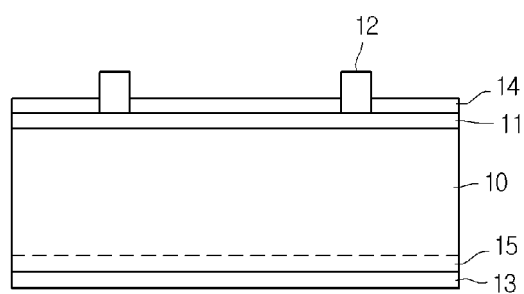

US 9,287,420 B2

SOLAR CELL AND PASTE COMPOSITION FOR REAR ELECTRODE OF THE SAME

CROSS-REFERENCE TO RELATED APPLICATIONS

This application is the U.S. national stage application of International Patent Application No. PCT/KR2011/005634, filed Jul. 29, 2011, which claims priority to Korean Application No. 10-2010-0074425, filed Jul. 30, 2010, the disclosures of each of which are incorporated herein by reference in their entirety.

TECHNICAL FIELD

The disclosure relates to a solar cell and a paste composition for a rear electrode of the solar cell.

BACKGROUND ART

Recently, the development of next generation clean energy has become more important due to the lack of fossil fuel. Among the next generation clean energy, a solar cell is spotlighted as an energy source for solving the future energy problem because it rarely causes environmental pollution and has the semi-permanent life span and there exists infinite resources for the solar cell.

Such a solar cell may include electrodes formed on a silicon substrate having an N type semiconductor and a P type semiconductor. However, if bonding strength between the electrodes and the silicon substrate is weak, moisture may penetrate into the electrodes under the high-temperature and high-humidity condition, so electric conductivity may be lowered. In extreme cases, the electrodes may be delaminated from the silicon substrate. In this case, the efficiency and the reliability of the solar cell may be degraded.

DISCLOSURE OF INVENTION

Technical Problem

The embodiment provides a paste composition for a rear electrode capable of improving the efficiency and the reliability of a solar cell, and the solar cell including the rear electrode prepared by using the paste composition.

Solution to Problem

A paste composition for a rear electrode of a solar cell according to the embodiment includes conductive powder; an organic vehicle; and an additive including silicon or a metal.

The additive includes at least one selected from the group consisting of silicon, silicon oil, silicon resin, silicon acetate, silicon nitride, silicon oxide and silicon carbide.

The silicon oil includes at least one selected from the group consisting of dimethyl silicon oil, methyl phenyl silicon oil, cyclic polydimethylsiloxane, and modified silicon oil.

The silicon resin has a siloxane bonding.

The additive includes at least one selected from the group consisting of Cu, Mg, Ni and an alloy including one of Cu, Mg and Ni.

The alloy includes at least one selected from the group consisting of metal oxide and metal additive salt.

The additive has a mean grain size in a range of 1 to 10 μm.

The paste composition includes 50 to 90 weight % of the conductive powder, 10 to 50 weight % of the organic vehicle, 0.1 to 20 weight % of the additive, and 0 to 20 weight % of glass frit.

The paste composition is a glass frit-free paste composition.

The paste composition is a lead-free paste composition.

The conductive powder includes aluminum powder.

According to another embodiment, there is provided a solar cell including a rear electrode manufactured by using the above paste composition.

Advantageous Effects of Invention

The paste composition for the rear electrode of the solar cell according to the embodiment includes an additive having silicon or a metal, so that the sintering density can be improved. Thus, the rear electrode prepared by using the paste composition represents superior bonding strength with respect to the silicon substrate. In addition, the sintering density can be improved without lowering the warp characteristic and the resistance characteristic of the back surface field layer.

Therefore, the solar cell including the rear electrode prepared by using the paste composition may represent the superior efficiency and reliability.

BRIEF DESCRIPTION OF DRAWINGS

FIG. 1 is a sectional view of a solar cell.

MODE FOR THE INVENTION

A paste composition for a rear electrode of a solar cell according to the embodiment includes conductive powder, an organic vehicle and an additive having silicon or a metal.

The conductive powder may be aluminum powder. The aluminum powder includes spherical powder. The aluminum powder may consist of same particles or various particles having properties different from each other. The aluminum particle may have a mean grain size of about 0.5 to 10 μm. However, the embodiment is not limited to the above, and various conductive powders can be employed in the embodiment.

The organic vehicle is prepared by dissolving a binder in a solvent. The organic vehicle may further include an anti-foaming agent and a dispersing agent. The solvent may include an organic solvent, such as terpineol or carbitol. The binder may include acryl-based resin, cellulous-based resin or alkyd resin. However, the embodiment is not limited to the above, and various organic vehicles can be employed in the embodiment.

The additive is a material including silicon or a metal. The additive enhances the interfacial bonding of the conductive powder and improves the density of the paste composition. Thus, the bonding strength between the rear electrode prepared by using the paste composition and the silicon substrate of the solar cell can be improved. As a result, the efficiency and the reliability of the solar cell can be improved.

Silicon, silicon oil, silicon resin, silicon acetate, silicon nitride, silicon oxide or silicon carbide can be included in the additive. For instance, the silicon oil may include dimethyl silicon oil, methyl phenyl silicon oil, cyclic polydimethylsiloxane, and modified silicon oil. The silicon resin may have the siloxane bonding.

The silicon oil, the silicon resin and the silicon compound including the silicon are decomposed through the thermal decomposition, thereby forming silicon, a silicon-aluminum alloy, or silicon oxide. Thus, the bonding strength between the silicon substrate and the rear electrode can be enhanced.

When the additive includes the metal, Cu, Mg Ni and an alloy having one of the above elements may be used as the metal. The metal may improve the sintering density and may serve as a gettering site when the aluminum is diffused to lower the resistance of the back surface field layer. In addition the metal may attenuate the difference in thermal expansion coefficient between the aluminum and the silicon substrate, thereby improving the warp property of a wafer.

The alloy may include metal oxide or metal additive salt. For instance, the metal oxide may include MgO or NiO. In addition, the metal additive salt may include Cu(OH), $Cu(OH)_2$, $Mg(OH)_2$, $Ni(OH)_2$, $Ni_2O_3H_2O$, or $NiCl_2$.

The thermal decomposition temperature for the additive is in the range of 100 to 400° C.

The additive has the mean grain size of 1 to 10 μm. If the grain size exceeds 10 μm, the paste composition may not be easily coated on the silicon substrate. If the grain size is less than 1 μm, explosion or oxidization may occur. That is, the mean grain size of the additive is determined by taking the coating process and stability into consideration.

The additive including the silicon or the metal may serve as a glass frit, so the glass frit may not be additionally required. Since the glass frit including lead (Pb) is not included in the paste composition, it is possible to prepare the environmental-friendly paste composition.

However, the paste composition may include the glass frit. In this case, the glass frit may include $PbO$—$SiO_2$, $PbO$—$SiO_2$—$B_2O_3$, $ZnO$—$SiO_2$, $ZnO$—$B_2O_3$—$SiO_2$, or $Bi_2O_3$—$B_2O_3$—$ZbO$—$SiO_2$.

For instance, the paste composition may include 50 to 90 weight % of the conductive powder, 10 to 50 weight % of the organic vehicle, 0.1 to 20 weight % of the additive, and 0 to 20 weight % of the glass frit.

If the amount of the conductive powder exceeds 90 weight %, it is difficult to form the composition in a paste state. If the amount of the conductive powder is less than 50 weight %, the amount of the conductive materials may be reduced, so that the resistance of the rear electrode may be increased.

If the amount of the organic vehicle exceeds 50 weight %, the resistance of the rear electrode may be increased. If the amount of the organic vehicle is less than 10 weight %, the bonding property with respect to the silicon substrate may be lowered.

If the amount of the additive exceeds 20 weight %, the amount of the conductive powder may be increased, so that the resistance of the rear electrode prepared by using the paste composition may be increased. In this case, the efficiency of the solar cell may be lowered. If the amount of the additive is less than 0.1 weight %, the effect of the additive is insufficient.

Thus, 0.5 to 10 weight % of the additive, preferably, 0.7 to 5 weight % of the additive is contained in the paste composition by taking the effect of the additive and the resistance of the rear electrode into consideration.

According to the paste composition of the embodiment, when the paste composition is sintered to manufacture the rear electrode by adding the additive including the silicon or the metal, the sintering density can be improved. Thus, the bonding strength between the paste composition and the silicon substrate can be improved. Due to the additive, the paste composition may exclude the glass frit including the lead (Pb), which is harmful to environment. If the additive includes the metal, such as Cu, Mg, Ni or an alloy thereof, the bonding strength between the paste composition and the silicon substrate can be improved without deteriorating the resistance of the rear electrode layer and the warp characteristic of the solar cell.

The paste composition can be prepared as follows.

First, the organic vehicle is prepared by dissolving the binder in the solvent and premixing the mixture. Then, the conductive powder and the additive are added to the organic vehicle and the mixture is aged for 1 to 12 hours. At this time, the glass frit may be added to the mixture. After that, the aged mixture is mechanically mixed and dispersed by using a 3-roll mill. Then, the mixture is filtered and defoamed, thereby preparing the paste composition. However, the above method is illustrative purpose only, and the embodiment is not limited thereto.

Hereinafter, an example of the solar cell employing the paste composition according to the embodiment will be described with reference to FIG. 1. FIG. 1 is a sectional view of the solar cell.

Referring to FIG. 1, the solar cell includes a P type silicon substrate 10 provided on the top surface thereof with an N type semiconductor 11, a front electrode 12 electrically connected to the N type semiconductor 11 and a rear electrode 13 electrically connected to the P type silicon substrate 10. An anti-reflective layer 14 can be formed on the top surface of the N type semiconductor 11 except for an area where the front electrode 12 is formed. In addition, a BSF (back surface field) layer 15 is formed on the rear electrode 13 of the silicon substrate 10.

The paste composition according to the embodiment can be used to form the rear electrode 13 of the solar cell. In detail, the paste composition is coated on the silicon substrate 10, and then the paste composition is dried and baked, thereby forming the rear electrode 13. For instance, the paste composition is dried for 1 to 30 minutes under the temperature of 80 to 200° C. and then baked under the temperature of 700 to 900° C. through the rapid thermal process.

The rear electrode 13 manufactured by using the paste composition according to the embodiment represents superior bonding strength with respect to the silicon substrate 10 so that the rear electrode 13 may not be delaminated from the silicon substrate 10 even if the rear electrode 13 is exposed to the high-temperature and high-humidity condition. Therefore, the reliability of the solar cell can be improved. In addition, the rear electrode 13 may not include the lead (Pb) or include only a little amount of the lead (Pb), so that the environmental-friendly solar cell can be obtained.

In addition, if the additive includes the metal, the wet property of the aluminum particles can be improved, so that the diffusion degree of the aluminum can be controlled. Thus, the back surface field layer 15 can be optimally formed.

Hereinafter, the disclosure will be described with reference embodiments thereof. However, the embodiments are illustrative purposes only and the disclosure is not limited to the embodiments.

Embodiment 1

The organic vehicle was prepared by dissolving the binder in the solvent. The solvent was prepared by mixing diethylene glycol monobutyl ether acetate with α terpineol and an ethyl cellulous binder was used as the binder. Then, the aluminum powder (conductive powder) and the silicon oil (additive) were added to and mixed with the organic vehicle. After aging the mixture for 12 hours, the aged mixture was secondarily mixed and dispersed by using the 3-roll mill. Then, the mixture was filtered and defoamed, thereby preparing the aluminum paste composition. At this time, the paste composition was comprised of 26 weight % of the organic vehicle, 73 weight % of the aluminum powder and 1 weight % of the silicon oil.

The paste composition was coated on the silicon substrate having the thickness of 200 μm through the screen printing scheme and then dried for 2 minutes under the temperature of 200° C. After that, the paste composition was subject to the rapid thermal process for 30 seconds under the temperature of 900° C., thereby forming the rear electrode.

Embodiment 2

The rear electrode was manufactured through the method the same as that of Embodiment 1 except that the paste composition was comprised of 25 weight % of the organic vehicle, 73 weight % of the aluminum powder and 2 weight % of the silicon oil.

Embodiment 3

The rear electrode was manufactured through the method the same as that of Embodiment 1 except that the paste composition was comprised of 24 weight % of the organic vehicle, 73 weight % of the aluminum powder and 3 weight % of the silicon oil.

Embodiment 4

The rear electrode was manufactured through the method the same as that of Embodiment 1 except that the paste composition was comprised of 23 weight % of the organic vehicle, 73 weight % of the aluminum powder and 4 weight % of the silicon oil.

Embodiment 5

The rear electrode was manufactured through the method the same as that of Embodiment 1 except that the paste composition was comprised of 23 weight % of the organic vehicle, 73 weight % of the aluminum powder, 1 weight % of the silicon oil and 3 weight % of $PbO-SiO_2-B_2O$ glass frit.

Embodiment 6

The rear electrode was manufactured through the method the same as that of Embodiment 1 except that the paste composition was comprised of 22 weight % of the organic vehicle, 73 weight % of the aluminum powder, 4 weight % of the silicon oil and 1 weight % of $PbO-SiO_2-B_2O$ glass frit.

Embodiment 7

Copper was used as the additive instead of the silicon oil. The rear electrode was manufactured through the method the same as that of Embodiment 1 except that the paste composition was comprised of 22 weight % of the organic vehicle, 73 weight % of the aluminum powder, 2 weight % of the copper and 3 weight % of $PbO-SiO_2-B_2O$ glass frit.

Embodiment 8

The rear electrode was manufactured through the method the same as that of Embodiment 7 except that Mg was used as additive instead of the copper.

Embodiment 9

The rear electrode was manufactured through the method the same as that of Embodiment 7 except that Ni was used as additive instead of the copper.

COMPARATIVE EXAMPLE

The rear electrode was manufactured through the method the same as that of Embodiment 1 except that the paste composition was comprised of 24 weight % of the organic vehicle, 73 weight % of the aluminum powder, and 3 weight % of $PbO-SiO_2-B_2O$ glass frit.

Aluminum surface resistance, resistance of the BSF layer, the warp characteristic and the bubbles tests have been performed with respect to the rear electrodes manufactured through Embodiment 1 to 9 and the comparative example and the result is show in Table 1. The bubble test was performed by inputting the silicon substrate formed with the rear electrode in water, which is double-boiled on a hot plate having the temperature of 80° C., and observing the amount of bubbles generated for one minute and the result was classified as good, normal and bad according to the amount of air.

TABLE 1

| | Al surface resistance [mΩ/□] | Resistance of BSF layer [mΩ/□] | warp characteristic [mm] | Bubble test result |
|---|---|---|---|---|
| Embodiment 1 | 17.9 | 29.07 | 0.665 | Normal |
| Embodiment 2 | 16.7 | 33.27 | 0.735 | Normal |
| Embodiment 3 | 17.15 | 36.48 | 0.862 | Good |
| Embodiment 4 | 17.54 | 32.20 | 0.74 | Good |
| Embodiment 5 | 15.2 | 33.43 | 0.852 | Good |
| Embodiment 6 | 16.3 | 36.02 | 0.936 | Good |
| Embodiment 7 | 15.68 | 10.15 | 0.925 | Good |
| Embodiment 8 | 15.22 | 10.5 | 1.12 | Good |
| Embodiment 9 | 17.19 | 9.22 | 0.93 | Good |
| Comparative example | 14.2 | 6.47 | 1.129 | Bad |

Referring to Table 1, the result of the bubble test in Embodiments 1 to 9 employing the additive is normal or good, but the result of the bubble test in the comparative example is bad. In detail, if the additive is employed, the sintering density of the rear electrode is enhanced so that the rear electrode may not be delaminated from the silicon substrate. In particular, in the cases of Embodiments 1 to 4, the result of the bubble test is normal or good although the glass frit is not included in the paste composition.

In the cases of Embodiments 7 to 9 employing the additive including the metal, the warp characteristic of the wafer is good, the resistance of the BSF layer is lowered, and the result of the bubble test is good.

The filler factor (FF) and the efficiency of the solar cell including the rear electrode according to Embodiments 4, 5 and 9 and the comparative example are shown in Table 2.

TABLE 2

| | Fill factor [%] | Efficiency (based on the comparative example = 1) |
|---|---|---|
| Embodiment 4 | 0.741 | 0.98 |
| Embodiment 5 | 0.742 | 0.96 |
| Embodiment 9 | 0.751 | 1.02 |
| Comparative example | 0.74 | 1 |

It can be understood from Table 2 that the solar cell including the rear electrode according to Embodiments 4, 5 and 9 has the fill factor and the efficiency similar to those of the comparative example. In particular, in the case of Embodiment 4, the he fill factor and the efficiency are similar to those of the comparative example although the glass frit is not used in the paste composition.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A paste composition for a rear electrode of a solar cell, the paste composition comprising:
    conductive powder;
    an organic vehicle; and
    an additive including silicon,
    wherein the additive includes silicon oil;
    wherein the silicon oil is selected from the group consisting of methyl phenyl silicon oil, cyclic polydimethylsiloxane, and modified silicon oil;
    wherein the paste composition includes 0.5 to 10 weight % of the additive; and
    wherein the paste composition includes 50 to 90 weight % of the conductive powder, 10 to 50 weight % of the organic vehicle, and 0 to 20 weight % glass frit.

2. The paste composition of claim 1, wherein the paste composition is a glass frit-free paste composition.

3. The paste composition of claim 1, wherein the paste composition is lead-free paste composition.

4. The paste composition of claim 1, wherein the conductive powder includes aluminum powder.

5. A solar cell including a rear electrode manufactured by using a paste composition according to claim 1.

* * * * *